United States Patent
Yun et al.

(10) Patent No.: US 8,352,662 B2
(45) Date of Patent: Jan. 8, 2013

(54) APPARATUS AND METHOD FOR SUPPORTING HOT PLUG DETECT FUNCTION IN PORTABLE TERMINAL USING HIGH DEFINITION MULTIMEDIA INTERFACE

(75) Inventors: Ha-Jung Yun, Gumi-si (KR); Hae-Jun An, Daegu (KR); Tae-Wook Lee, Daegu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 514 days.

(21) Appl. No.: 12/624,906

(22) Filed: Nov. 24, 2009

(65) Prior Publication Data

US 2010/0128178 A1 May 27, 2010

(30) Foreign Application Priority Data

Nov. 25, 2008 (KR) .................. 10-2008-0117259

(51) Int. Cl.
*G06F 13/00* (2006.01)
*H04N 7/16* (2011.01)
*H04N 5/46* (2006.01)

(52) U.S. Cl. .................. 710/302; 725/111; 348/558

(58) Field of Classification Search .................. 725/111; 348/558; 710/302
See application file for complete search history.

(56) References Cited

U.S. PATENT DOCUMENTS

| | | | |
|---|---|---|---|
| 7,945,708 B2* | 5/2011 | Ohkita ............................ | 710/14 |
| 2005/0141851 A1* | 6/2005 | Nakayama et al. ............. | 386/46 |
| 2005/0289626 A1* | 12/2005 | Aboulgasem et al. ......... | 725/106 |
| 2006/0256241 A1* | 11/2006 | Suzuki et al. .................. | 348/706 |
| 2008/0111921 A1* | 5/2008 | Tung et al. ..................... | 348/554 |
| 2008/0291986 A1* | 11/2008 | Lida et al. ...................... | 375/222 |
| 2010/0097529 A1* | 4/2010 | Tokoro .......................... | 348/730 |
| 2011/0121810 A1* | 5/2011 | Tsai ............................... | 323/318 |

\* cited by examiner

*Primary Examiner* — Paul R Myers
*Assistant Examiner* — Christopher a Daley
(74) *Attorney, Agent, or Firm* — Jefferson IP Law, LLP

(57) ABSTRACT

An apparatus and method for supporting a Hot Plug Detect (HPD) function in a portable terminal using High Definition Multimedia Interface (HDMI) are provided. The apparatus includes an HPD unit for generating an HPD signal using an operation voltage of a first modem upon connecting to a display apparatus through an HDMI cable, the first modem for enabling a second modem upon detecting the HPD signal, and the second modem for outputting video data upon being enabled by the first modem.

20 Claims, 4 Drawing Sheets

APPARATUS AND METHOD FOR SUPPORTING HOT PLUG DETECT FUNCTION IN PORTABLE TERMINAL USING HIGH DEFINITION MULTIMEDIA INTERFACE

PRIORITY

This application claims the benefit under 35 U.S.C. §119 (a) of a Korean patent application filed in the Korean Intellectual Property Office on Nov. 25, 2008 and assigned Serial No. 10-2008-0117259, the entire disclosure of which is hereby incorporated by reference.

BACKGROUND OF THE INVENTION

1. Field of the Invention

The present invention relates to an apparatus and a method for supporting a Hot Plug Detect (HPD) function. More particularly, the present invention relates to an apparatus and method for supporting an HPD function in a portable terminal using High Definition Multimedia Interface (HDMI).

2. Description of the Related Art

With the rapid enhancement of digital products, several trends are underway, such as integration. More specifically, interfaces which connect between digital video apparatuses have been combined and complicated functions of the digital video apparatuses are becoming simplified. For example, a High Definition Multimedia Interface (HDMI) is becoming popular as a digital interface.

The HDMI is an interface for transferring digital video data including motion picture data and audio data. The HDMI supports high definition video data communication between an apparatus for transferring digital video data, such as a set top box (e.g., apparatuses for video transferring), a High Definition (HD) player (e.g., an HD-Digital Video Disc (DVD), Blu-ray, and the like), a digital television (TV), a computer, a camcorder and a camera, and an apparatus for displaying, such as a video display apparatus (i.e., Cathode Ray Tube (CRT)), a monitor, a braun tube TV, a Liquid Crystal Display (LCD) TV and a Plasma Display Panel (PDP) TV.

A digital video data transferring apparatus, which has transmitting and receiving chips and connectors for HDMI, outputs HD video data to a display apparatus through a dedicated HDMI cable.

FIG. 1 illustrates a conventional connection between video transferring apparatuses, such as a camcorder or a camera.

Referring to FIG. 1, a camcorder or a camera 100 and a display apparatus 110 are connected through an HDMI cable 120. The camcorder or the camera 100 records or plays video data and outputs a video signal to the display apparatus 110 using the HDMI.

The camcorder or the camera 100 includes a multimedia modem 102 that encodes the video signal. The display apparatus 110 receives the video signal from the camcorder or the camera 100 through the HDMI cable 120 and displays corresponding video data to a screen.

According to the type of HDMI cable, a connector pin number of the HDMI cable 120 may be 19 pins or 29 pins. An 18th pin of the connector with 19 pins is used for +5V and a 19th pin of the connector with 19 pins is used for a Hot Plug Detect (HPD) function.

When the camcorder or the camera 100 and the display apparatus 110 are connected through the HDMI cable 120, the camcorder or the camera 100 outputs +5V to the display apparatus 110 using the 18th pin. The camcorder or the camera 100 then determines whether the +5V is normally fed back using the 19th pin. That is, when the +5V is supplied by the camcorder or the camera 100 to the display apparatus 110 through the HDMI cable 120, the display apparatus 110 directly feeds back the +5V to the camcorder or the camera 100 using an HPD line 104.

The camcorder or the camera 100 determines that the connection through the HDMI cable 120 is normal when the feedback voltage is +5V. Accordingly, the camcorder or the camera 100 outputs video data to the display apparatus 110 and the display apparatus 110 displays the video data The camcorder or the camera 100 determines that the connection through the HDMI cable 120 is not normal when the feedback voltage is not +5V. Thus, the camcorder or the camera 100 does not output the video data to the display apparatus 110.

A resistor (R2) 108 is a pull down register that stabilizes a voltage together with a resistor (R1) 106. The HPD line 104 of the multimedia modem 102 operates in a voltage range from +3V to +5.3V. A constant voltage of +3.3V is supplied to the HPD line 104 by R1 106 and R2 108.

Most portable terminals have camera modules so that it is possible to take a picture and record video data. Recently, a multimedia modem is installed in the portable terminal so that it is possible to process a high definition video and to output high definition video data and pictures to a display apparatus when there is support of an HDMI function in the portable terminal.

However, a communication modem is installed in the portable terminal besides the multimedia modem. Thus, it is necessary to support an HPD function for confirming the connection by the communication modem when the display apparatus is connected to the portable terminal. In the conventional technology, it is not necessary to support the HPD function in the portable terminal. However, it is necessary to support the HPD function according to the installment of the multimedia modem.

Therefore, a need exists for an apparatus and method for supporting an HPD function in a portable terminal using HDMI.

SUMMARY OF THE INVENTION

An aspect of the present invention is to address at least the above-mentioned problems and/or disadvantages and to provide at least the advantages described below. Accordingly, an aspect of the present invention is to provide an apparatus and a method for supporting a Hot Plug Detect (HPD) function in a portable terminal using High Definition Multimedia Interface (HDMI).

Another aspect of the present invention is to provide an apparatus and a method for protecting an HPD port of a communication modem from a surge voltage in a portable terminal upon connecting a display apparatus using HDMI.

In accordance with an aspect of the present invention, an apparatus for supporting an HPD function in a portable terminal using HDMI is provided. The apparatus includes an HPD unit for generating an HPD signal using an operation voltage of a first modem when connecting to a display apparatus through an HDMI cable, the first modem for enabling a second modem upon detecting the HPD signal and the second modem for outputting video data upon being enabled by the first modem.

In accordance with another aspect of the present invention, a method for supporting an HPD function in a portable terminal using HDMI is provided. The method includes generating an HPD signal, by an HPD unit, using an operation voltage of a first modem upon connecting to a display apparatus through an HDMI cable, providing the HPD signal, by the HPD unit, to the first modem, enabling a second modem, by the first modem, upon detecting the HPD signal, and outputting video data, by the second modem, upon being enabled by the first modem.

In accordance with yet another aspect of the present invention, a system for transferring video data is provided. The system includes a portable terminal for converting a specific voltage supplied by a display apparatus to a operation voltage of a operating communication modem upon connecting to the display apparatus through an HDMI cable, for performing an HPD function, and for controlling to supply the specific voltage from the display apparatus to a multimedia modem after enabling the multimedia modem which is disabled, and the display apparatus for receiving video data from the portable terminal through the HDMI cable and displaying the video data.

Other aspects, advantages and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will become more apparent from the following description taken in conjunction with the accompanying drawings, in which.

Throughout the drawings, like reference numerals will be understood to refer to like parts, components and structures

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Hereinafter, an apparatus and method for supporting a Hot Plug Detect (HPD) function in a portable terminal using High Definition Multimedia Interface (HDMI) will be described.

Figure 1:
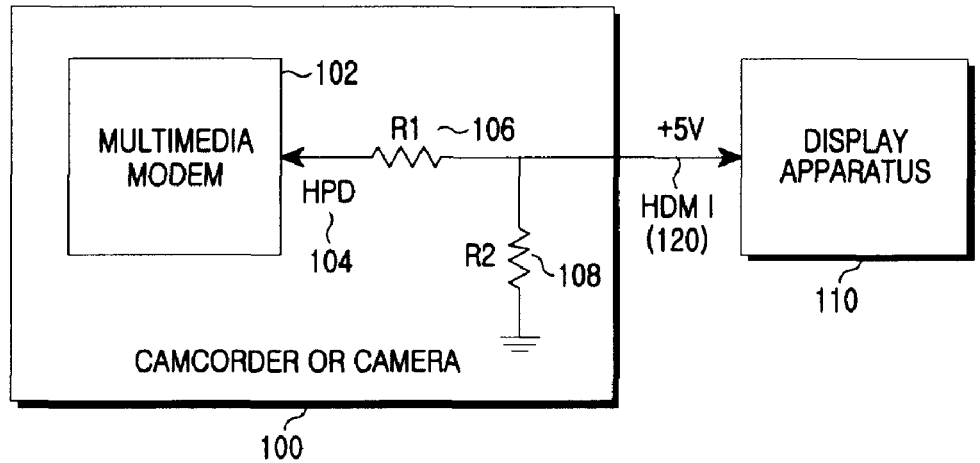
FIG. 1 illustrates a conventional connection between video transferring apparatuses.
Figure 2:
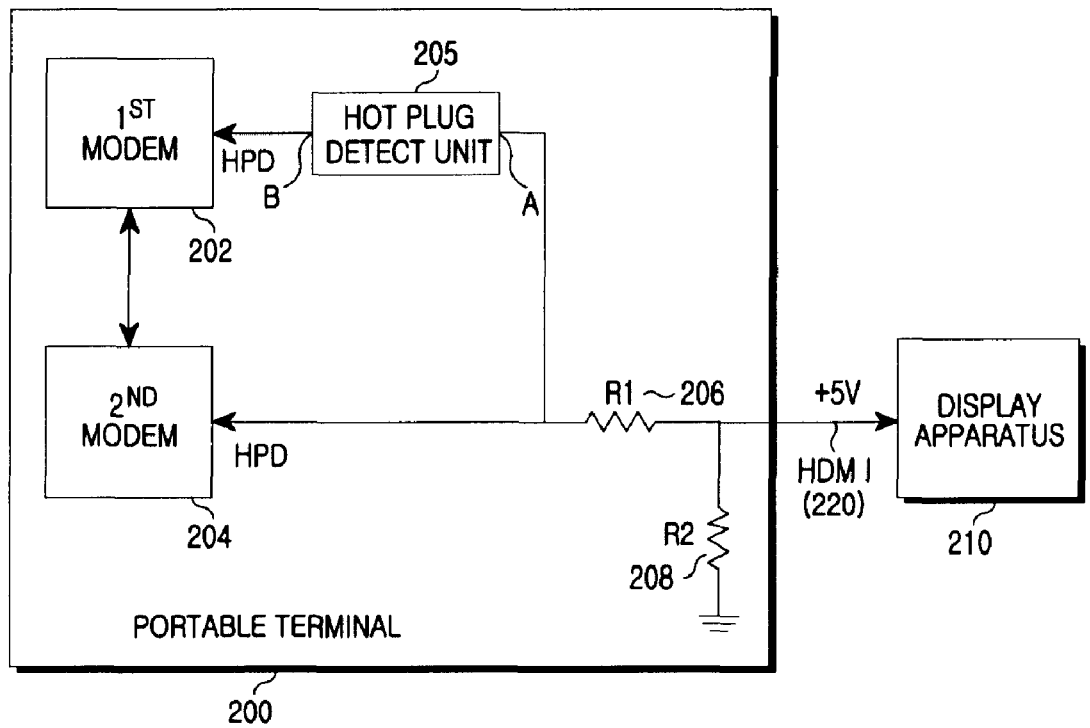
FIG. 2 illustrates a block diagram for supporting a Hot Plug Detect (HPD) function in a portable terminal using High Definition Multimedia Interface (HDMI) according to an exemplary embodiment of the present invention.

FIG. 2 illustrates a block diagram for supporting an HPD function in a portable terminal using HDMI according to an exemplary embodiment of the present invention.

Referring to FIG. 2, the portable terminal 200 and a display apparatus 210 are connected with an HDMI cable 220. According to the type of HDMI cable, a total pin number of the HDMI cable 220 may be 18 pins or 19 pins. In a connector using 19 pins, the 18th pin is used for a +5V supply and the 19th pin is used for the HPD function.

The portable terminal 200 performs voice and data communication with a mobile communication system using a first modem 202. The portable terminal 200 reproduces or produces video data (i.e., high definition video data) by demodulating or modulating a video signal using a second modem 204. Then, the portable terminal 200 outputs a high definition video signal to the display apparatus 210 through the HDMI cable 220. Herein, the first modem 202 may be enabled for maintaining a link with the mobile communication system. The second modem 204 may be enabled when the portable terminal 200 and the display apparatus 210 are connected through the HDMI cable 220 or when the portable terminal 200 is producing video data. The second modem 204 may be deactivated otherwise.

When the portable terminal 200 and the display apparatus 210 are connected through the HDMI cable 220, the first modem 202 outputs +5V using a boost converter (not illustrated), under a control of the first modem 202, to the display apparatus 210.

The display apparatus 210 feeds back the +5V to the portable terminal 210 using a 19th pin in a connector of the HDMI cable 220. An HPD unit 205 outputs an operation voltage (e.g., +2.6V) to the first modem 202 using the +5V supplied by the display apparatus 210.

A more detailed description of the HPD unit 205 will be made below with reference to FIG. 3 and FIG. 4.

When the operation voltage (e.g., +2.6 V) is supplied by the HPD unit 205 to the first modem 202, the first modem 202 confirms a connection between the HDMI cable 200 and the display apparatus 210. The first modem 202 generates a connection completion report to the display apparatus 210 using a control channel. The operation voltage supplied is +2.6V, but the operation voltage may vary according to conditions of the HPD unit 205.

Also, the second modem, which is disabled, is enabled by the first modem. The first modem makes the second modem perform an HPD function. That is, after the second modem is enabled under control of the first modem, the second modem outputs video data to the display apparatus 210 when the second modem receives a feedback of +5V from the display apparatus 210 through the HDMI cable 220. The display apparatus 210 then displays the video data.

When the feedback voltage is not +5V, the second modem determines that the connection between the HDMI cable 200 and the display apparatus 210 is not normal and the second modem does not output the video data to the display apparatus 210.

Herein, a resistor (R2) 208 is a pull down register that stabilizes a voltage together with a resistor (R1) 206. That is, an HPD line of the second modem 204 operates in a voltage range from +3V to +5.3V. A constant voltage of +3.3V is supplied to the HPD line of the second modem by R1 206 and R2 208.

Herein, the first modem 202 performs the HPD function instead of the second modem 204, which is disabled. The second modem, which is enabled from a disabled status, performs the HPD function because the second modem, which normally produces and reproduces video data, outputs the video data after the HPD function. That is, the second modem may output the video data when +3.3V is supplied to a port for the HPD function in the second modem.

In an exemplary implementation, the first modem 202 performs the HPD function and confirms a connection of the HDMI cable 220. After the confirmation, the first modem transmits a control signal to the second modem so that the second modem may output the video data directly without performing the HPD function.

Although a portable terminal has been described in an exemplary embodiment of the present, the present invention is not limited thereto. For example, the present invention may include a mobile communication module, a camera module, a Bluetooth module, a receiving module for digital broadcasting, and the like.

Figure 3:
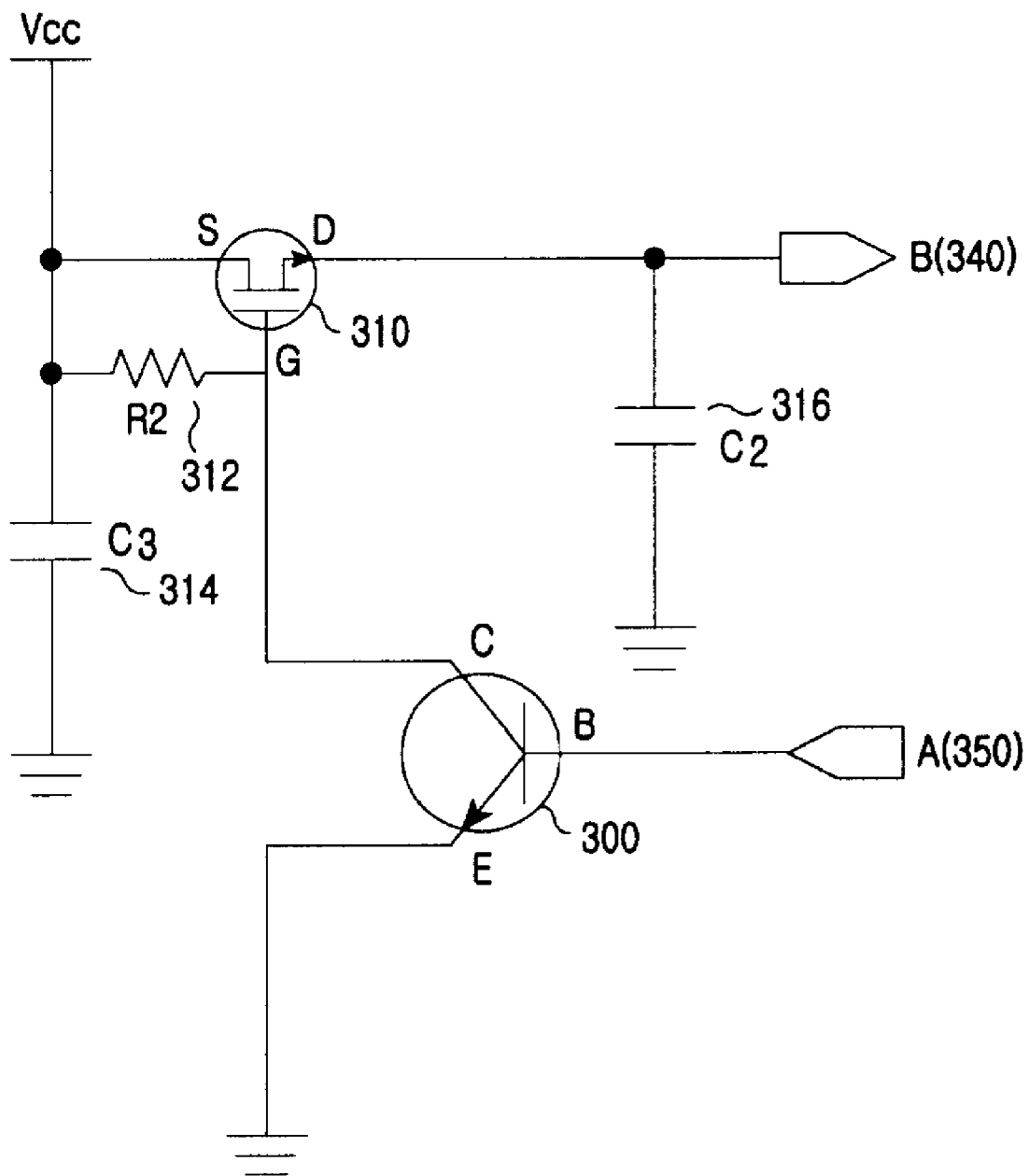
FIG. 3 illustrates a circuit configuration of an HPD unit according to an exemplary embodiment of the present invention.

FIG. 3 illustrates a circuit configuration of an HPD unit according to an exemplary embodiment of the present invention.

Referring FIG. 3, when the HDMI cable 220 is not connected between the portable terminal 200 and the display apparatus 210 in FIG. 2, a terminal (A) 350 goes to a LOW state (0V) so that a voltage is not supplied to a base terminal (B) of a transistor 300.

When the voltage is not supplied to the base terminal (B) of the transistor 300, the transistor 300 goes to an OFF state. When the transistor 300 goes to the OFF state, a gate terminal (G) of a Field Effect Transistor (FET) 310 goes to a HIGH state. Herein, when the gate terminal (G) of the FET 310 goes to the HIGH state, the FET 310 goes to an OFF state. Then, an output of a terminal (B) 340 goes to a LOW state. Therefore, when the input terminal (A) 350 of the HPD unit 205 in FIG. 2 goes to the LOW state, the output of the terminal (B) 340 goes to the LOW state. Thus, the first modem 202 confirms the display apparatus 210 is not connected.

On the other hand, when the HDMI cable 220 is connected between the portable terminal 200 and the display apparatus 210 in FIG. 2, +5V is supplied by the display apparatus 210 to the HPD unit 205. The terminal (A) 350 goes to a HIGH state (+5V). The voltage is then supplied to the base terminal (B) of the transistor 300. The transistor 300 goes to an ON state because the voltage is supplied to the base terminal (B) of the transistor 300. When the transistor 300 goes to the ON state, a collector terminal (C) and an emitter terminal (E) of the transistor 300 are connected with ground. Thus, the gate terminal (G) of the FET 310 goes to a LOW state. When the gate terminal (G) of the FET 310 goes to the LOW state, the FET 310 goes to an ON state.

A Vcc (+2.6V) is then supplied to the terminal (B) 340 because the FET 310 goes to the ON state. The Vcc (+2.6V) is an operation voltage of the first modem 202 and the Vcc is generated from a voltage source in the portable terminal. The output of the terminal (B) 340 of the HPD unit 205 in FIG. 2 goes to a HIGH state when the input terminal (A) 350 of the HPD unit 205 in FIG. 2 goes to the HIGH state. Therefore, the first modem 202 confirms the display apparatus 210 is connected.

A resistor ($R_2$) 312 is a pull up register to maintain a source voltage level of the FET 310, and a capacitor ($C_3$) 314 and a capacitor ($C_2$) 316 stabilize a voltage.

Figure 4:
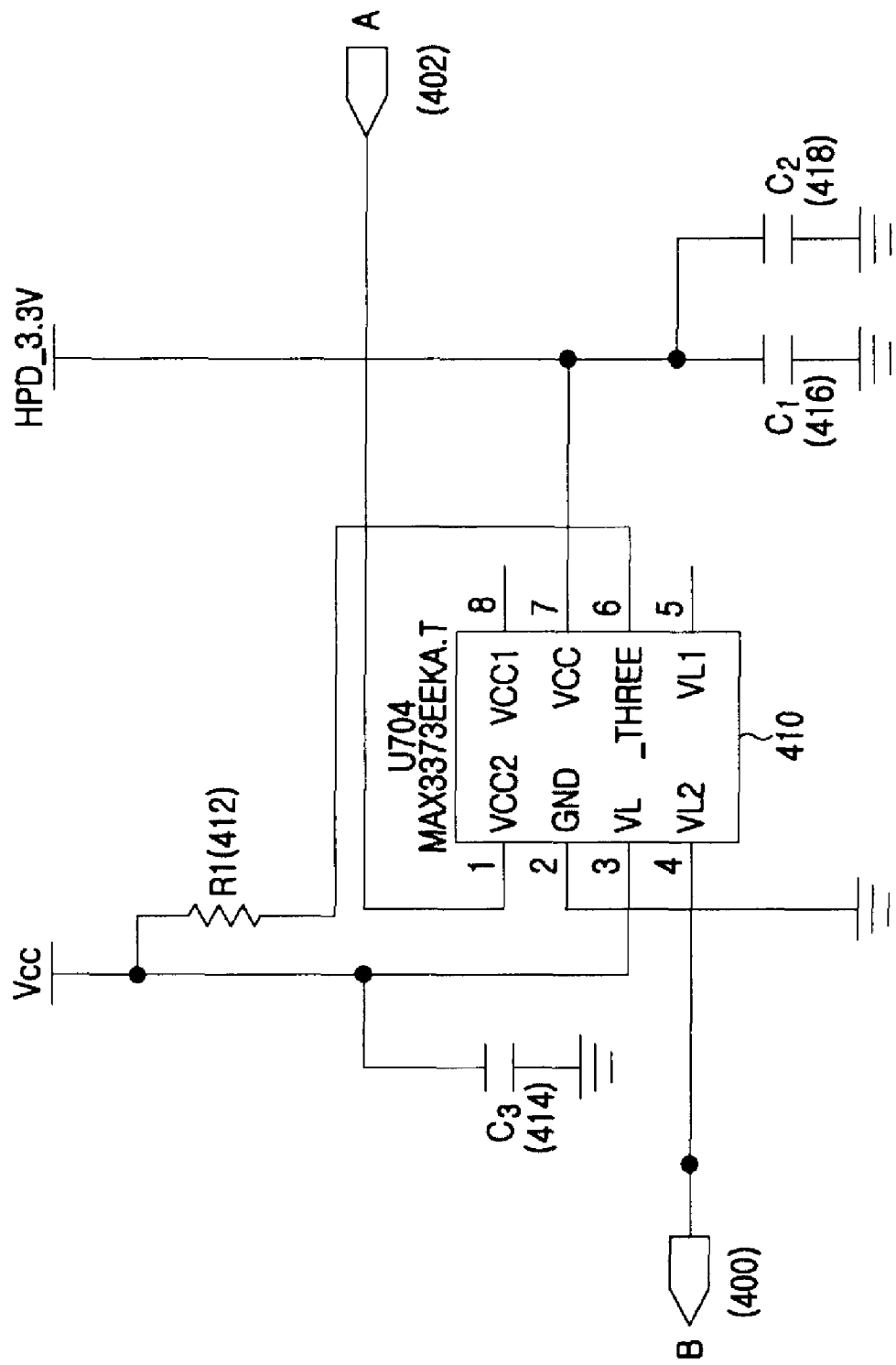
FIG. 4 illustrates a block diagram of an HPD unit according to an exemplary embodiment of the present invention.

FIG. 4 illustrates a block diagram of an HPD unit according to an exemplary embodiment of the present invention.

Referring to FIG. 4, a level shifter 410 is used for the HPD. A terminal (B) 400 of a first modem 202 is used as a General Purpose Input Output (GPIO) port and the first modem 202 determines level status from LOW state to HIGH state at the terminal (B) 400.

When the portable terminal 200 and the display apparatus 210 are connected through the HDMI cable 220, +5V from the display apparatus 310 is converted to +3.3V by the resistors ($R_1$) 206 and ($R_2$) 208 in FIG. 2. The +3.3V is then supplied to the terminal (A) 402.

The +3.3V from the terminal (A) 402 enables the level shifter 410 and the level shifter 410 supplies a reference voltage +2.6V to the terminal (B) 400. A more detailed description of an internal operation of an exemplary level shifter 410 is referenced in data sheet MAX3373EEA-T.

A resistor ($R_1$) 412 is a pull up resistor to enable the level shifter 410 constantly, and a capacitor ($C_3$) 414, a capacitor ($C_1$) 416 and a capacitor ($C_2$) 418 stabilize a voltage.

Figure 5:
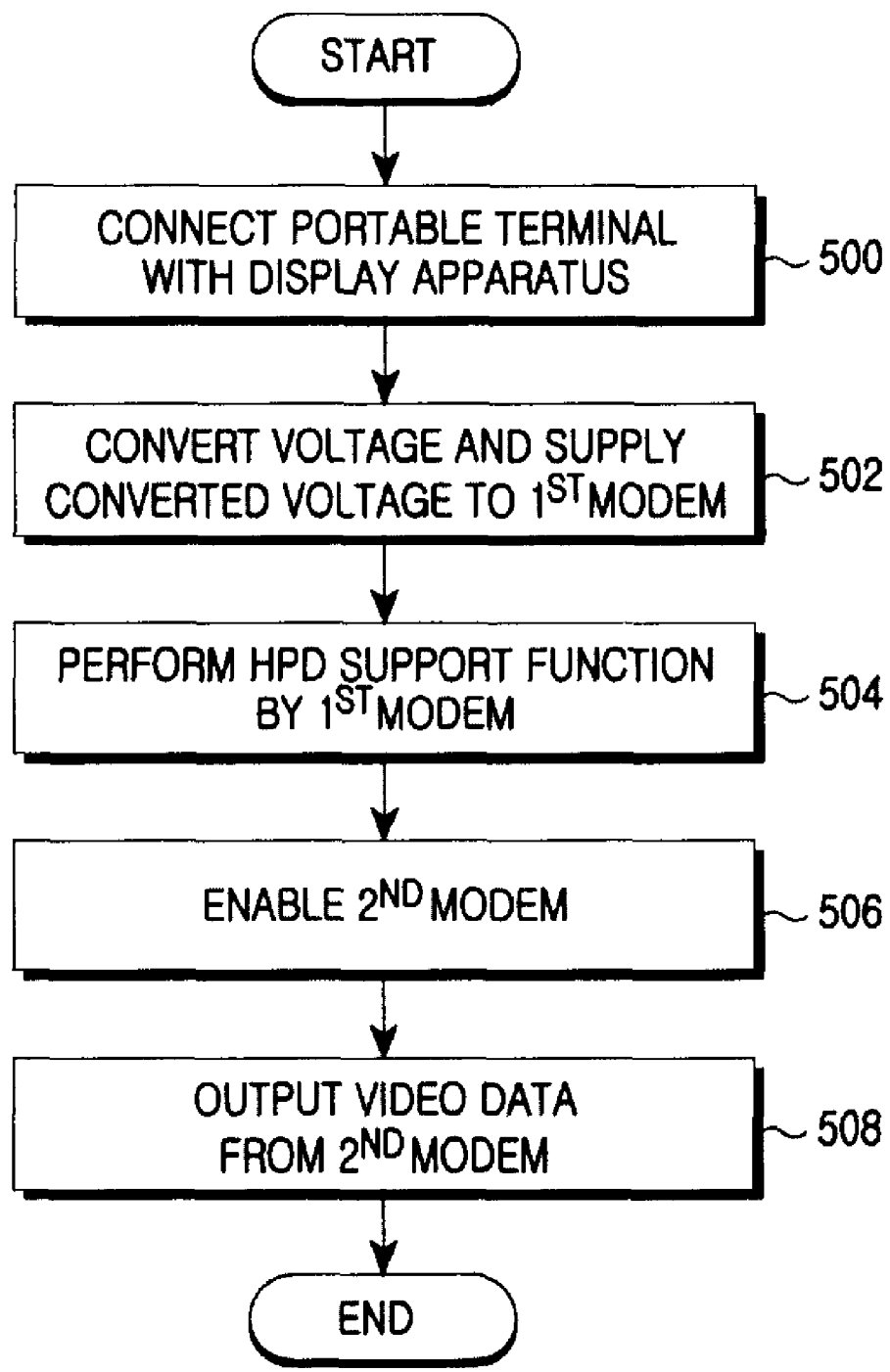
FIG. 5 illustrates a flowchart for outputting video data from a portable terminal to a display apparatus using HDMI according to an exemplary embodiment of the present invention.

FIG. 5 illustrates a flowchart for outputting video data from a portable terminal to a display apparatus using HDMI according to an exemplary embodiment of the present invention.

Referring to FIG. 5, when the portable terminal is connected with the display apparatus in step 500, an HPD unit 205 converts a voltage supplied by the display apparatus to an operation voltage of the first modem 202 in step 502. A more detailed procedure of step 502 is described with reference to FIG. 3 or FIG. 4.

The first modem then performs an HPD function in step 504 so that the first modem confirms the connection of the HDMI cable. The first modem enables a second modem, which is disabled, using a control channel in step 506.

The second modem outputs video data to the display apparatus in step 508 after the second modem performs an HPD function.

In an exemplary implementation, the first modem performs the HPD function in step 504 to confirm the connection of the HDMI cable. The first modem may then transmit a control signal for the second modem to output video data to the display apparatus without the HPD function by the second modem.

The portable terminal then ends the algorithm.

As set forth above, the portable terminal in an exemplary embodiment of the present invention performs the HPD function. Therefore, a communication modem in the portable terminal is protected from a surge voltage when the portable terminal is connected to the display apparatus using HDMI.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An apparatus for supporting a Hot Plug Detect (HPD) function in a portable terminal using High Definition Multimedia Interface (HDMI), the apparatus comprising:
an HPD unit for, upon connecting to a display apparatus through an HDMI cable, supplying an operation voltage in response to an input voltage to a first modem, wherein the input voltage is supplied from the display apparatus;
the first modem for enabling a second modem upon detecting the operation voltage; and
the second modem for outputting video data upon being enabled by the first modem.

2. The apparatus of claim 1, wherein the first modem generates a connection completion report to the display apparatus when connected to the display apparatus.

3. The apparatus of claim 1, wherein the HPD unit comprises a level shifter so that the HPD unit outputs the operation voltage of the first modem upon connecting to the display apparatus through the HDMI cable.

4. The apparatus of claim 3, wherein the portable terminal uses the level shifter to convert a specific voltage supplied by the display apparatus to the operation voltage of the first modem.

5. The apparatus of claim 1, wherein the HPD unit comprises a first switch and a second switch, the first switch goes to an ON state upon connecting to the display apparatus through the HDMI cable, the second switch goes to an ON state when the first switch goes to the ON state, and the second switch outputs the operation voltage of the first modem.

6. The apparatus of claim 1, wherein the second modem performs the HPD function together with the display apparatus connected with the HDMI cable.

7. The apparatus of claim 1, wherein the HPD unit is supplied a specific voltage by the display apparatus through the HDMI cable upon connecting to the display apparatus.

8. The apparatus of claim 1, wherein the first modem is configured for performing at least one of voice and data communication with a mobile communication system.

9. The apparatus of claim 1, wherein the first modem is configured to perform an HPD function and for confirming connection between the portable terminal and the display apparatus through the HDMI cable, and
wherein the first modem is further configured to transmit a control signal to the second modem such that the second modem outputs the video data without performing the HPD function.

10. A method for supporting a Hot Plug Detect (HPD) function in a portable terminal using High Definition Multimedia Interface (HDMI), the method comprising:
supplying an operation voltage in response to an input voltage, by an HPD unit, to the first modem, upon connecting to a display apparatus through an HDMI cable, wherein the input voltage is supplied from the display apparatus;
enabling a second modem, by the first modem, upon detecting the operation voltage; and
outputting video data, by the second modem, upon being enabled by the first modem.

11. The method of claim 10, further comprising generating a connection completion report to the display apparatus when connected to the display apparatus.

12. The method of claim 10, further comprising performing the HPD function, by the second modem, together with the display apparatus connected with the HDMI cable.

13. The method of claim 10, further comprising supplying a specific voltage, by the display apparatus, to the first modem upon connecting to the display apparatus through the HDMI cable.

14. The method of claim 13, further comprising converting the specific voltage supplied by the display apparatus to an operation voltage of the first modem.

15. The method of claim 10, wherein the first modem is configured for performing at least one of voice and data communication with a mobile communication system.

16. The method of claim 10, further comprising:
confirming, by the first modem, the connection between the portable terminal and the display apparatus through the HDMI cable,
wherein the second modem outputs the video data without performing an HPD function.

17. A system for transferring video data, the system comprising:
a portable terminal for converting a specific voltage supplied by a display apparatus to an operation voltage of an operating communication modem upon connecting to the display apparatus through a High Definition Multimedia Interface (HDMI) cable, for performing a Hot Plug Detect (HPD) function, and for controlling to supply the specific voltage from the display apparatus to a multimedia modem after enabling the multimedia modem which is disabled; and,
the display apparatus for receiving video data from the portable terminal through the HDMI cable and displaying the video data.

18. The system of claim 17, wherein the portable terminal comprises an HPD unit comprising a level shifter.

19. The system of claim 18, wherein the portable terminal uses the level shifter to convert the specific voltage supplied by the display apparatus to the operation voltage of the operating communication modem.

20. The system of claim 17, wherein the portable terminal uses a first switch and a second switch to convert the specific voltage supplied by the display apparatus to the operation voltage of the operating communication modem, the first switch goes to an ON state upon connecting to the display apparatus through the HDMI cable, the second switch goes to an ON state when the first switch goes to the ON state, and the operation voltage of the operating communication modem is output.

* * * * *